(12) United States Patent
Xuan

(10) Patent No.: US 9,978,687 B1
(45) Date of Patent: May 22, 2018

(54) SEMICONDUCTOR SUBSTRATE

(71) Applicant: UNITED MICROELECTRONICS CORP., Hsin-Chu (TW)

(72) Inventor: Pandeng Xuan, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days. days.

(21) Appl. No.: 15/403,188

(22) Filed: Jan. 11, 2017

(51) Int. Cl.
*H01L 23/544* (2006.01)
*H01L 21/78* (2006.01)

(52) U.S. Cl.
CPC .... *H01L 23/544* (2013.01); *H01L 2223/5442* (2013.01); *H01L 2223/54426* (2013.01)

(58) Field of Classification Search
USPC ........................................................ 257/797
See application file for complete search history.

(56) References Cited

U.S. PATENT DOCUMENTS

| | | | | |
|---|---|---|---|---|
| 5,777,392 A | * | 7/1998 | Fujii | ..................... G03F 9/7084 257/620 |
| 9,104,831 B2 | | 8/2015 | Huang | |
| 2012/0044470 A1 | | 2/2012 | Smilde | |

* cited by examiner

*Primary Examiner* — Seahvosh Nikmanesh
*Assistant Examiner* — Xiaoming Liu
(74) *Attorney, Agent, or Firm* — Winston Hsu

(57) ABSTRACT

A semiconductor substrate includes a first exposure shot region, a second exposure shot region aligned with the first exposure shot region in a first direction, first overlay marks, second overlay marks, and a scribe lane. The first overlay marks are disposed in a first peripheral part of the first exposure shot region. The second overlay marks are disposed in a second peripheral part of the second exposure shot region. The scribe lane is disposed between a first center part of the first exposure shot region and a second center part of the second exposure shot region. A center point of the first overlay mark disposed within the scribe lane and a center point of the second overlay mark which is closest to the first overlay mark are arranged in a second direction different from the first direction for increasing the distance between the first and the second overlay marks.

13 Claims, 6 Drawing Sheets

SEMICONDUCTOR SUBSTRATE

BACKGROUND OF THE INVENTION

1. Field of the Invention

The present invention relates to a semiconductor substrate, and more particularly, to a semiconductor substrate including overlay marks.

2. Description of the Prior Art

In semiconductor manufacturing processes, in order to transfer an integrated circuit onto a semiconductor wafer, the integrated circuits from a database are first designed as a layout pattern and a photomask is then manufactured according to the layout pattern. Patterns on the photomask may then be able to be transferred to the semiconductor wafer. The steps mentioned above may be regarded as a photolithographic process. The layout pattern has to be extremely accurate for forming delicate integrated circuits so as to align with the patterns of the previous and following steps.

The overlay errors between different patterned layers might occur for many reasons, such as the alignment accuracy of the exposure apparatus, wafer warpage, and influence from other manufacturing processes. The overlay errors have to be monitored for quality control and being used to modify the exposure parameters and/or find out the cause of the overlay error. Accordingly, overlay marks are inserted in the layout pattern and formed on the semiconductor wafer for monitoring the overlay condition. However, as the size of the scribe lanes between different dies and/or different exposure shots becomes smaller for obtaining more areas for effective dies from the semiconductor wafer, the overlay marks disposed in the scribe lanes have to become closer to one another, and the overlay measurement may suffer measurement problems because of the adjoining overlay marks.

SUMMARY OF THE INVENTION

It is one of the objectives of the present invention to provide a semiconductor substrate. Overlay marks disposed within a scribe lane between two adjacent exposure shot regions are arranged in a direction different from a direction where the two adjacent exposure shot regions are arranged for increasing the distance between the two overlay marks adjacent to each other and disposed within the same scribe lane. The measurement problems of the overlay marks disposed too close to each other because the size of the scribe lane gets smaller may be improved accordingly.

A semiconductor substrate is provided in an embodiment of the present invention. The semiconductor substrate includes a first exposure shot region, a second exposure shot region adjoining the first exposure shot region, a plurality of first overlay marks, a plurality of second overlay marks, and a scribe lane. The first exposure shot region and the second exposure shot region are aligned in a first direction The first exposure shot region includes a first center part and a first peripheral part encompassing the first center part. The second exposure shot region includes a second center part and a second peripheral part encompassing the second center part. The first overlay marks are disposed in the first peripheral part, and the second overlay marks are disposed in the second peripheral part. The scribe lane is disposed between the first center part and the second center part in the first direction. At least one of the first overlay marks and at least one of the second overlay marks are disposed within the scribe lane. A center point of the first overlay mark within the scribe lane and a center point of the second overlay mark which is closest to the first overlay mark are arranged in a second direction different from the first direction.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
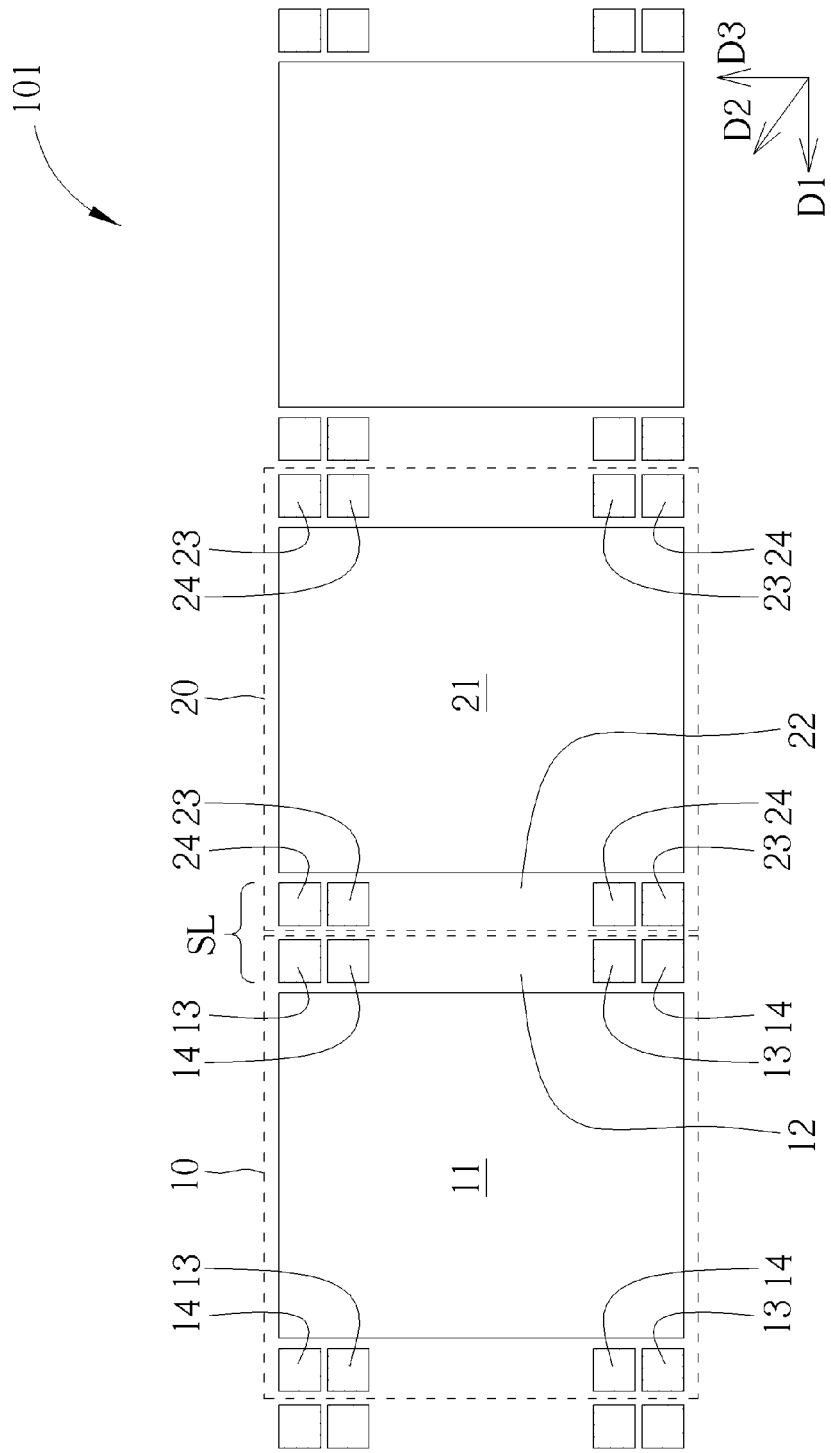
FIG. 1 is a schematic drawing illustrating a semiconductor substrate according to a first embodiment of the present invention.
Figure 2:
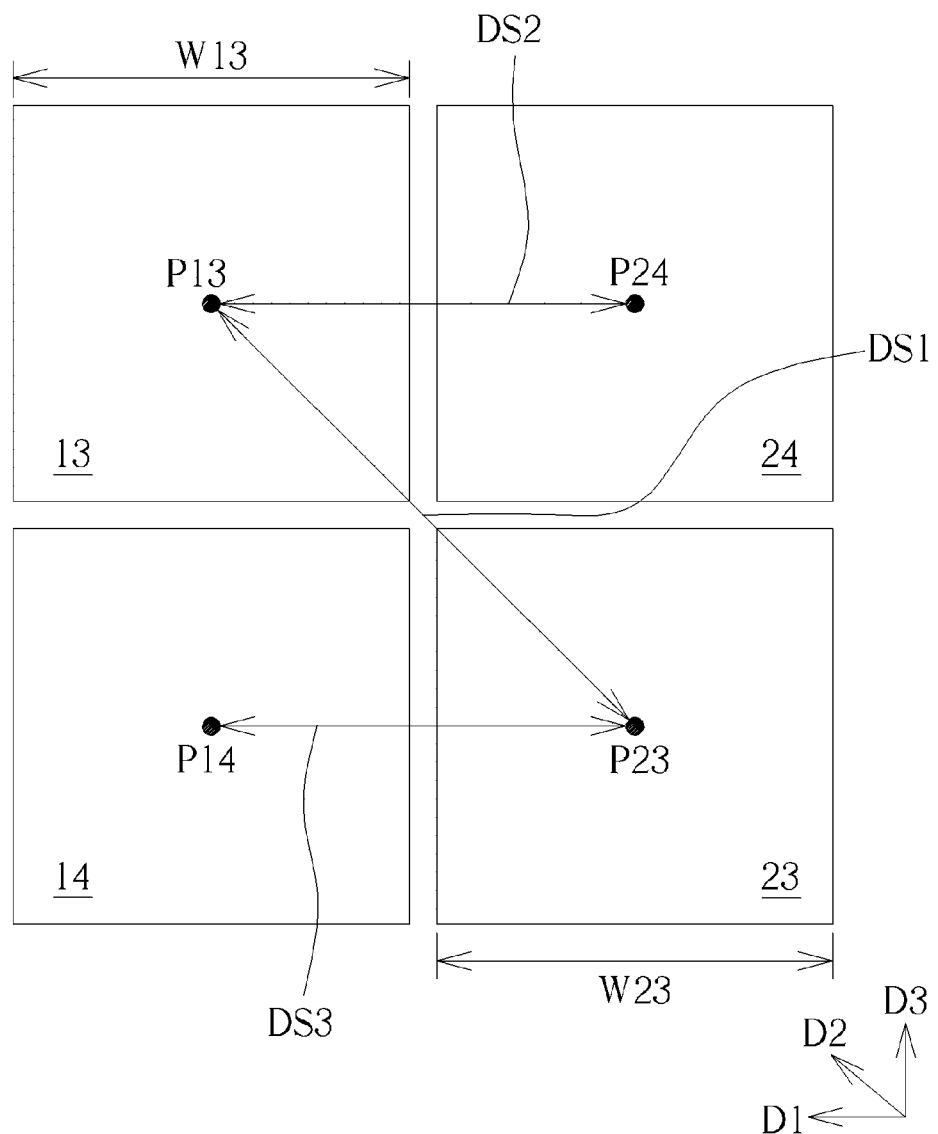
FIG. 2 is a schematic drawing illustrating an arrangement of overlay marks and logo regions in the semiconductor substrate according to the first embodiment of the present invention.
Figure 3:
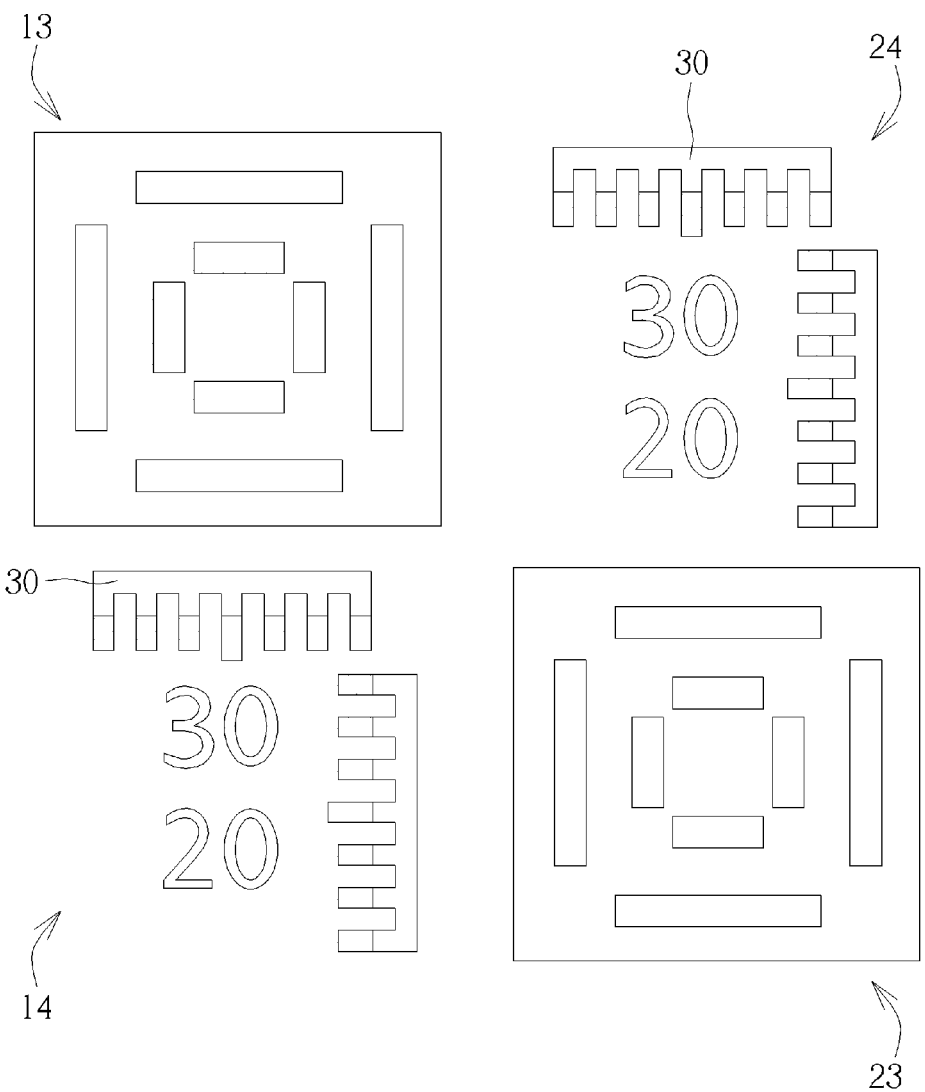
FIG. 3 is a schematic drawing illustrating an example of the overlay marks and the logo regions in the semiconductor substrate according to the first embodiment of the present invention.
Figure 4:
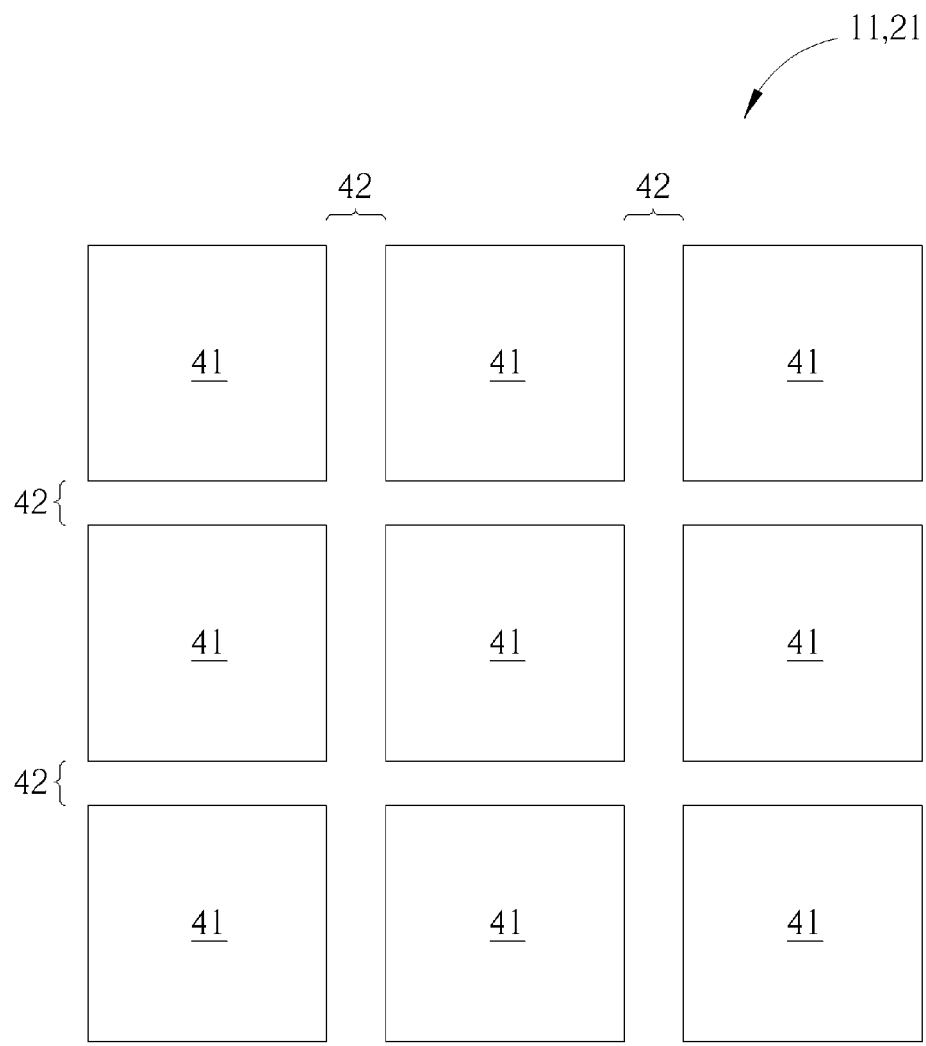
FIG. 4 is a schematic drawing illustrating a first center part and/or a second center part in the semiconductor substrate according to the first embodiment of the present invention.

Please refer to FIGS. 1-4. FIG. 1 is a schematic drawing illustrating a semiconductor substrate according to a first embodiment of the present invention. FIG. 2 is a schematic drawing illustrating an arrangement of overlay marks and logo regions in the semiconductor substrate of this embodiment. FIG. 3 is a schematic drawing illustrating an example of the overlay marks and the logo regions FIG. 4 is a schematic drawing illustrating a first center part and/or a second center part in the semiconductor substrate according to the first embodiment of the present invention. As shown in FIG. 1, a semiconductor substrate 101 is provided in this embodiment. Specifically, FIG. 1 may be a schematic drawing illustrating a part of the semiconductor substrate 101, and other parts of the semiconductor substrate 101 may include the components shown in FIG. 1 repeatedly, but not limited thereto. The semiconductor substrate 101 includes a plurality of exposure shot regions, and each of the exposure shot regions is a region corresponding to one exposure shot in each of the exposure processes for forming different patterned layers. The patterns in the exposure shot regions may be identical to one another because the corresponding exposure shots for the same layer may be performed with the same photomask, but not limited thereto. In some embodiments of the present invention, the patterns in the exposure shot regions may be different from one another because the corresponding exposure shots for the same layer may be also performed with different photomasks. For example, the semiconductor substrate 101 includes a first exposure shot region 10 and a second exposure shot region 20 adjoining the first exposure shot region 10. The first exposure shot region 10 and the second exposure shot region 20 are aligned in a first direction D1. The area of the first exposure shot region 10 may be equal to the area of the second exposure shot region 20, but not limited thereto. The first exposure shot region 10 includes a first center part 11 and a first peripheral part 12 encompassing the first center part 11. The second exposure shot region 20 includes a second center part 21 and a second peripheral part 22 encompassing the second center part 21.

The semiconductor substrate 10 further includes a plurality of first overlay marks 13, a plurality of second overlay marks 23, and a scribe lane SL. The first overlay marks 13 are disposed in the first peripheral part 12 of the first exposure shot region 10, and the second overlay marks 23 are disposed in the second peripheral part 22 of the second exposure shot region 20. The scribe lane SL is disposed between the first center part 11 of the first exposure shot region 10 and the second center part 21 of the second exposure shot region 20 in the first direction D1. At least one of the first overlay marks 13 and at least one of the second overlay marks 23 may be disposed within the scribe lane SL. For example, there may be four first overlay marks 13 and four second overlay marks 23 disposed in the first peripheral part 12 and the second peripheral part 22 respectively. The four first overlay marks 13 may be disposed at four corners of the first exposure shot region 10 respectively, and the four second overlay marks 23 may also be disposed at four corners of the second exposure shot region 20 respectively. Therefore, two of the first overlay marks 13 and two of the second overlay marks 23 may be disposed within the scribe line SL between the first center part 11 and the second center part 21, but not limited thereto. Some of the first overlay marks 13 may be disposed within another scribe lane between the first exposure shot region 10 and another exposure shot region, and some of the second overlay marks 23 may be disposed within another scribe lane between the second exposure shot region 20 and another exposure shot region. In some embodiments of the present invention, there may be only one first overlay mark 13 and only one second overlay mark 23 disposed within the scribe line SL between the first center part 11 and the second center part 21, but not limited thereto.

As shown in FIG. 1 and FIG. 2, a center point P13 of the first overlay mark 13 within the scribe lane SL and a center point P23 of the second overlay mark 23 which is disposed within the scribe lane SL and is closest to the first overlay mark 13 are arranged in a second direction D2 different from the first direction D1. The second direction D2 is not parallel and not orthogonal to the first direction D1. An included angle between the first direction D1 and the second direction D2 may be larger than 0 degree and smaller than 90 degrees. For example, the included angle between the first direction D1 and the second direction D2 may be substantially equal to 45 degrees, but not limited thereto. In comparison with a condition that the first overlay mark and the second overlay mark disposed in the same scribe lane are disposed side by side and arranged in the first direction D1, the distance between the first overlay mark 13 and the closest second overlay mark 23 arranged in the second direction D2 may be larger than the distance between the first overlay mark and the second overlay mark aligned in the first direction D1. In other words, the distance between the first overlay mark 13 and the closest second overlay mark 23 in the scribe lane SL may become larger because the first overlay mark 13 and the closest second overlay mark 23 are arranged in an oblique direction.

In some embodiments, there may be not any overlay mark disposed between the second center part 21 and the first overlay mark 13 within the scribe lane SL in the first direction D1, and there may be not any overlay mark disposed between the first center part 11 and the second overlay mark 23 within the scribe lane SL in the first direction D1 for ensuring that the first overlay mark 13 and the closest second overlay mark 23 are separated far enough, but not limited thereto. In some embodiment, a part of the second overlay mark 23 which is closest to the first overlay mark 13 may be disposed between the second center part 21 and the first overlay mark 13 in the first direction D1, and a part of the first overlay mark 13 which is closest to the second overlay mark 23 may be disposed between the first center part 11 and the second overlay mark 23 in the first direction D1.

As shown in FIG. 1 and FIG. 2, the semiconductor substrate 10 may further include a plurality of first logo regions 14 and a plurality of second logo regions 24. The first logo regions 14 are disposed in the first peripheral part 12 of the first exposure shot region 10, and the second logo regions 24 are disposed in the second peripheral part 22 of the second exposure shot region 20. Each of the first logo regions 14 may be disposed adjacent to one of the first overlay marks 13, and each of the second logo regions 24 may be disposed adjacent to one of the second overlay marks 23. For example, two of the first logo regions 14 may be disposed in the first peripheral part 12 and within the scribe line SL between the first center part 11 and the second center part 21, and two of the second logo regions 24 may be disposed in the second peripheral part 22 and within the scribe line SL between the first center part 11 and the second center part 21. However, in some embodiments, there may be only one first logo region 14 and only one second logo region 24 disposed within the scribe line SL between the first center part 11 and the second center part 21, but not limited thereto. Additionally, the first logo region 14 may be disposed adjacent to the first overlay mark 13 within the scribe lane SL in a third direction D3 orthogonal to the first direction D1, and the second logo region 24 may be disposed adjacent to the second overlay mark 23 within the scribe lane SL in the third direction D3. In some embodiments, the first logo region 14 may be disposed between the first center part 11 and the second overlay mark 23 within the scribe lane SL in the first direction D1, and the second logo region 24 may be disposed between the second center part 21 and the first overlay mark 13 within the scribe lane SL in the first direction D1, but not limited thereto.

As shown in FIG. 2, in some embodiments, the center point P13 of the first overlay mark 13 and a center point P24 of the second logo region 24 may be arranged in the first direction D1, and the center point P23 of the second overlay mark 23 and a center point P14 of the first logo region 14 may be arranged in the first direction D1. A distance DS1 between the center point P13 of the first overlay mark 13 within the scribe lane SL and the center point P23 of the second overlay mark 23 which is closest to the first overlay mark 13 is larger than a distance DS2 between the center point P13 of the first overlay mark 13 and the center point P24 of the second logo region 24, and the distance DS1 between the center point P13 of the first overlay mark 13 within the scribe lane SL and the center point P23 of the second overlay mark 23 which is closest to the first overlay mark 13 is larger than a distance DS3 between the center point P23 of the second overlay mark 23 and the center point P14 of the first logo region 14. The distance DS1 between the center point P13 of the first overlay mark 13 within the scribe lane SL and the center point P23 of the second overlay mark 23 which is closest to the first overlay mark 13 is larger than a width W13 of the first overlay mark 13 and/or a width W23 of the second overlay mark 23 in the first direction D1. In some embodiments, the center point P14 of the first logo region 14 and the center point P24 of the second logo region 24 may be arranged in a direction different from the first direction D1, the second direction D2, and the third direction D3, but not limited thereto.

As shown in FIG. 1 and FIG. 3, the semiconductor substrate 101 may further include vernier patterns 30 disposed in the first logo region 14 and/or the second logo region 24. The vernier patterns 30 may be used to roughly show the overlay condition between different patterned layers directly by a microscope, but not limited thereto. Additionally, there may be other patterns disposed in the first logo region 14 and the second logo region 24, such as numbers for identifying different patterned layers. It is worth noting that the patterns of the first overlay mark 13 and the second overlay mark 23 are not limited to the patterns shown in FIG. 3, and other appropriate alignment/overlay patterns may be used to form the first overlay mark 13 and the second overlay mark 23.

As shown in FIG. 1 and FIG. 4, the first center part 11 of the first exposure shot region 10 and/or the second center part 21 of the second exposure shot region 20 may include a plurality of die regions 41 and a plurality of sub scribe lanes 42. The die regions 41 are separated from one another by the sub scribe lanes 42. In other words, the semiconductor substrate 101 may be a semiconductor wafer, and the first center part 11 of the first exposure shot region 10 and/or the second center part 21 of the second exposure shot region 20 may be used to form a plurality of dies after a cutting process. However, in some embodiments of the present invention, the first center part 11 of the first exposure shot region 10 and/or the second center part 21 of the second exposure shot region 20 may also be a region corresponding to only one die respectively.

In this embodiment, the first overlay mark 13 and the second overlay mark 14 disposed within the scribe lane SL between the first center part 11 of the first exposure shot region 10 and the second center part 21 of the second exposure shot region 20 are arranged in a direction different from a direction where the first exposure shot region 10 and the second exposure shot region 20 are arranged for increasing the distance between the first overlay mark 13 and the second overlay mark 14 adjacent to each other and disposed within the same scribe lane SL. The measurement problems, such as a tool-induced shift (TIS), of the overlay marks disposed too close to each other because the size of the scribe lane SL gets smaller may be improved accordingly.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 5:
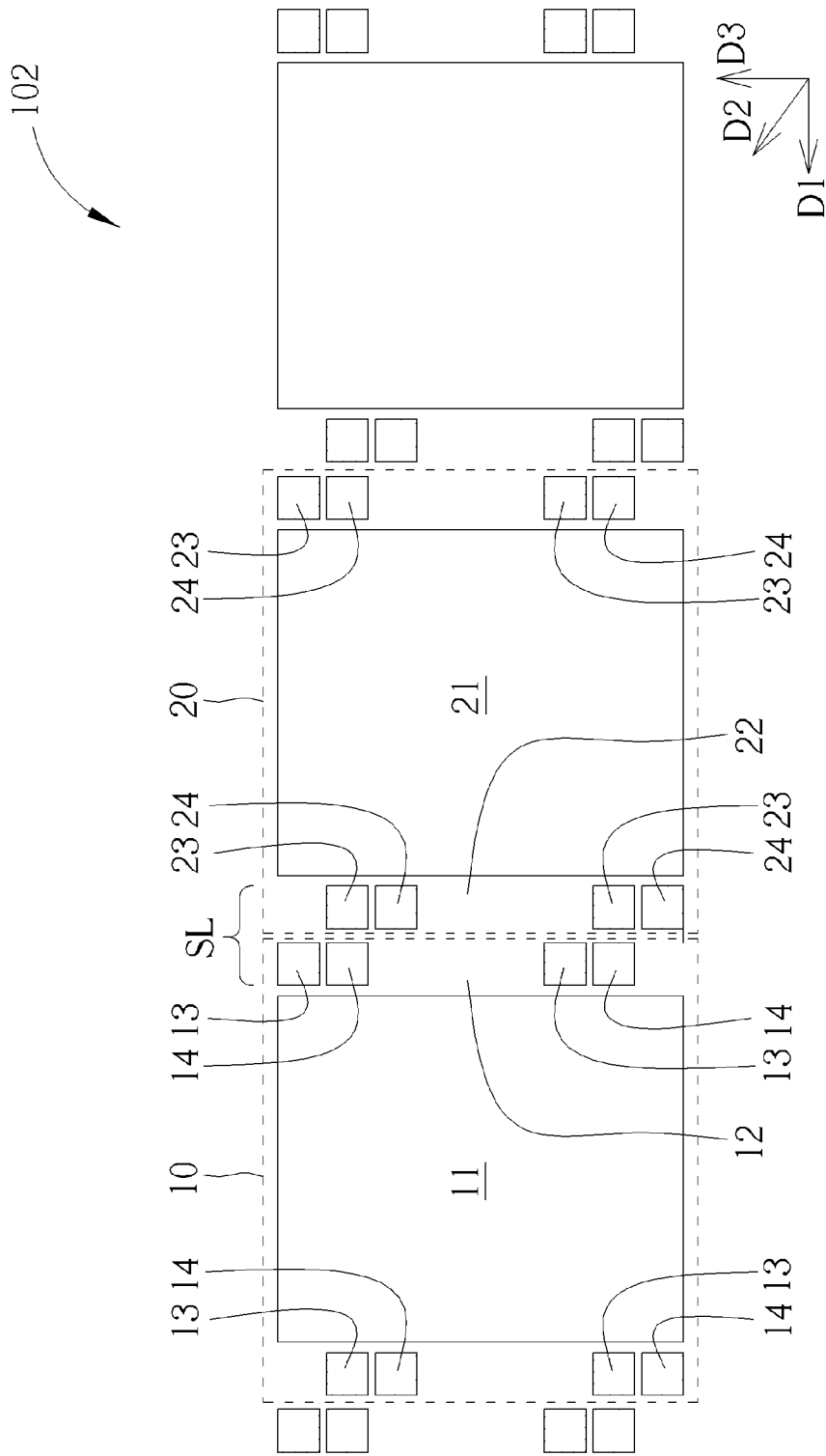
FIG. 5 is a schematic drawing illustrating a semiconductor substrate according to a second embodiment of the present invention.

Please refer to FIG. 5. FIG. 5 is a schematic drawing illustrating a semiconductor substrate 102 according to a second embodiment of the present invention. As shown in FIG. 5, the difference between the semiconductor substrate 102 and the semiconductor substrate in the first embodiment is that the second logo region 24 in this embodiment may be disposed at an opposite side of the second overlay mark 23 in comparison with the second logo region of the first embodiment mentioned above. Therefore, in this embodiment, there is not any overlay mark and logo region disposed between the first center part 11 of the first exposure shot region 10 and the second logo region 24 within the scribe lane SL in the first direction D1.

Figure 6:
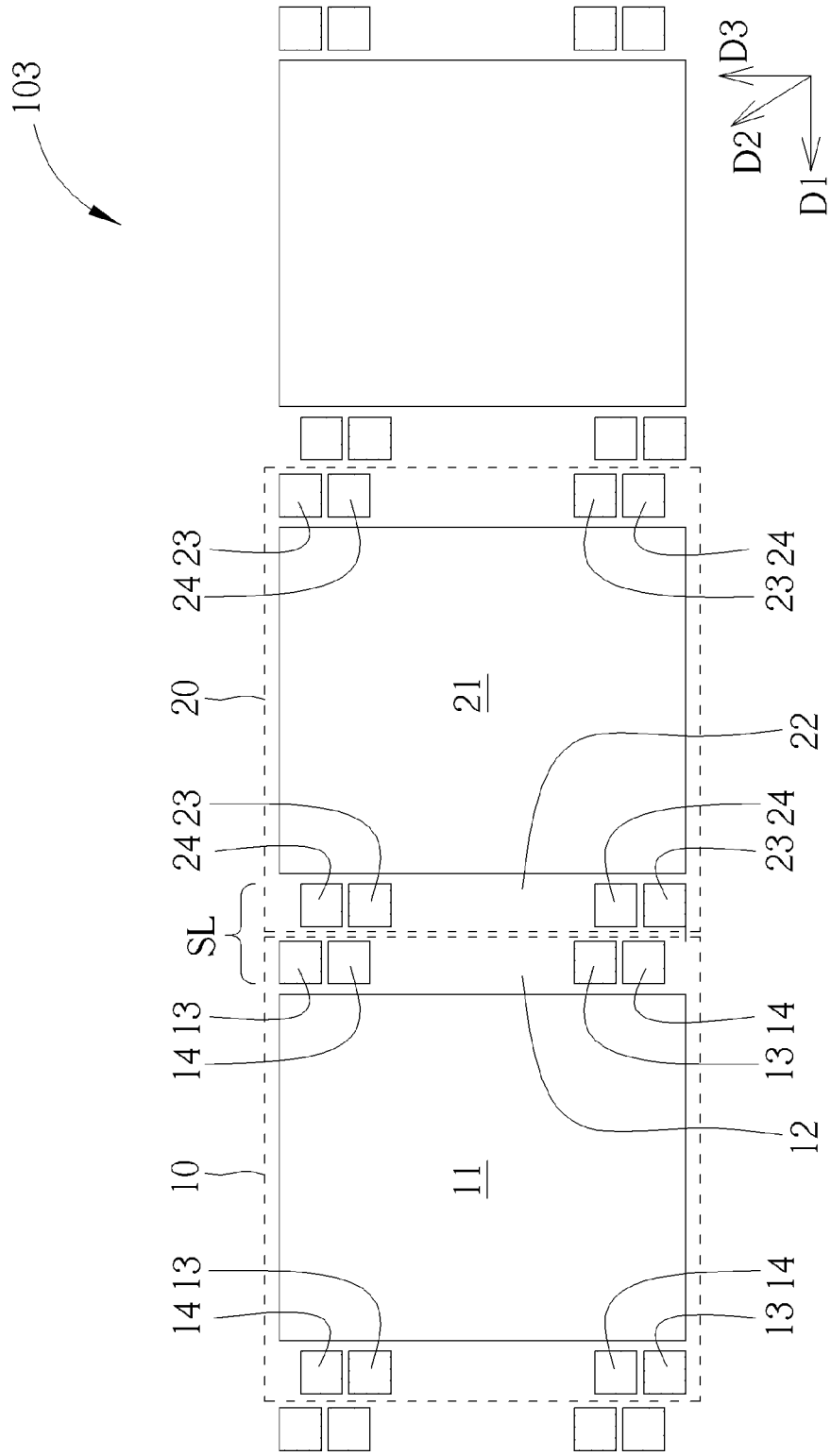
FIG. 6 is a schematic drawing illustrating a semiconductor substrate according to a third embodiment of the present invention.

Please refer to FIG. 6. FIG. 6 is a schematic drawing illustrating a semiconductor substrate 103 according to a third embodiment of the present invention. As shown in FIG. 6, the difference between the semiconductor substrate 103 and the semiconductor substrate in the first embodiment is that included angle between the first direction D1 and the second direction D2 may be larger than 45 degrees in this embodiment, and the distance between the center point of the first overlay mark 13 within the scribe lane SL and the center point of the second overlay mark 23 which is closest to the first overlay mark 13 may become larger than that of the first embodiment accordingly.

To summarize the above descriptions, in the semiconductor substrate of the present invention, the first overlay mark and the second overlay mark disposed within the scribe lane between the first center part of the first exposure shot region and the second center part of the second exposure shot region are arranged in a direction different from a direction where the first exposure shot region and the second exposure shot region are arranged for increasing the distance between the first overlay mark and the second overlay mark adjacent to each other and disposed within the same scribe lane SL. Accordingly, problems such as a tool-induced shift (TIS) in the overlay measurement when the overlay marks are disposed too close to each other may be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor substrate, comprising:
   a first exposure shot region comprising:
   a first center part; and
   a first peripheral part encompassing the first center part;
   a second exposure shot region adjoining the first exposure shot region, wherein the first exposure shot region and the second exposure shot region are aligned in a first direction, and the second exposure shot region comprises:
   a second center part; and
   a second peripheral part encompassing the second center part;
   a plurality of first overlay marks disposed in the first peripheral part;
   a plurality of second overlay marks disposed in the second peripheral part;
   a scribe lane disposed between the first center part and the second center part in the first direction, wherein at least one of the first overlay marks and at least one of the second overlay marks are disposed within the scribe lane, and a center point of the first overlay mark within the scribe lane and a center point of the second overlay mark which is closest to the first overlay mark are arranged in a second direction different from the first direction;
   a first logo region disposed in the first peripheral part and within the scribe line, wherein the first logo region is disposed adjacent to the first overlay mark within the scribe lane in a third direction orthogonal to the first direction; and a second logo region disposed in the second peripheral part and within the scribe line, wherein the second logo region is disposed adjacent to the second overlay mark within the scribe lane in the third direction, there is not any overlay mark disposed in the first logo region and the second logo region, and there is not any alignment mark disposed in the first logo region and the second logo region.

2. The semiconductor substrate according to claim 1, wherein there is not any overlay mark disposed between the second center part and the first overlay mark within the scribe lane in the first direction.

3. The semiconductor substrate according to claim 1, wherein there is not any overlay mark disposed between the first center part and the second overlay mark within the scribe lane in the first direction.

4. The semiconductor substrate according to claim 1, wherein the second direction is not parallel and not orthogonal to the first direction.

5. The semiconductor substrate according to claim 1, wherein a distance between the center point of the first overlay mark within the scribe lane and the center point of the second overlay mark which is closest to the first overlay mark is larger than a distance between the center point of the first overlay mark and a center point of the second logo region.

6. The semiconductor substrate according to claim 1, wherein a distance between the center point of the first overlay mark within the scribe lane and the center point of the second overlay mark which is closest to the first overlay mark is larger than a distance between the center point of the second overlay mark and a center point of the first logo region.

7. The semiconductor substrate according to claim 1, wherein the first logo region is disposed between the first center part and the second overlay mark within the scribe lane in the first direction.

8. The semiconductor substrate according to claim 1, wherein the second logo region is disposed between the second center part and the first overlay mark within the scribe lane in the first direction.

9. The semiconductor substrate according to claim 1, wherein a center point of the first logo region and a center point of the second logo region are arranged in a direction different from the first direction.

10. The semiconductor substrate according to claim 1, further comprises vernier patterns disposed in the first logo region and/or the second logo region.

11. The semiconductor substrate according to claim 1, wherein the first center part and/or the second center part comprises:

a plurality of die regions; and a plurality of sub scribe lanes, wherein the die regions are separated from one another by the sub scribe lanes.

12. The semiconductor substrate according to claim 1, wherein a distance between the center point of the first overlay mark within the scribe lane and the center point of the second overlay mark which is closest to the first overlay mark is larger than a width of the first overlay mark and/or a width of the second overlay mark in the first direction.

13. The semiconductor substrate according to claim 1, wherein two of the first overlay marks and two of the second overlay marks are disposed within the scribe lane between the first center part and the second center part in the first direction.

* * * * *